United States Patent

Pelgrom et al.

[19]

[11] Patent Number: 4,627,082

[45] Date of Patent: Dec. 2, 1986

[54] SEMICONDUCTOR DEVICE FOR OBTAINING AN ACCURATE THRESHOLD VOLTAGE ADJUSTMENT

[75] Inventors: Marcellinus J. M. Pelgrom; Hendrik A. Harwig; Jan W. Slotboom, all of Eindhoven, Netherlands

[73] Assignee: U.S. Philips Corporation, New York, N.Y.

[21] Appl. No.: 634,923

[22] Filed: Jul. 26, 1984

[30] Foreign Application Priority Data

Aug. 2, 1983 [NL] Netherlands .................. 8302731

[51] Int. Cl.[4] ............. G11C 19/28; H01L 29/78
[52] U.S. Cl. ........................ 377/60; 357/24; 307/299 R; 307/304; 307/363; 330/288
[58] Field of Search .......... 307/607, 571, 577, 299 R, 307/304, 501, 363; 330/277, 288; 357/24; 377/60, 58, 57

[56] References Cited

U.S. PATENT DOCUMENTS

| | | | |
|---|---|---|---|
| 4,068,140 | 1/1978 | Lou | 307/304 |
| 4,096,430 | 6/1978 | Waldron | 323/22 R |
| 4,191,896 | 3/1980 | Sauer et al. | 307/221 D |
| 4,327,321 | 4/1982 | Suzuki et al. | 323/315 |
| 4,453,094 | 6/1984 | Peil et al. | 307/451 |
| 4,477,782 | 10/1984 | Swanson | 330/288 |

*Primary Examiner*—Stanley D. Miller
*Assistant Examiner*—Richard Roseen
*Attorney, Agent, or Firm*—Robert T. Mayer; Steven R. Biren

[57] ABSTRACT

The invention relates to an integrated MOS circuit comprising a MOS transistor which is connected as a resistor and which, when conducting current, generates a voltage which is supplied to the source/gate of a second field effect device. In order to obtain a suitable current adjustment, the two channel widths are chosen so that due to narrow channel effects, a difference (though small) in threshold voltage is obtained. The invention is of particular interest for CCD input circuits for generating a small offset voltage required for supplying FAT-zero.

2 Claims, 8 Drawing Figures

SEMICONDUCTOR DEVICE FOR OBTAINING AN ACCURATE THRESHOLD VOLTAGE ADJUSTMENT

BACKGROUND OF THE INVENTION

The invention relates to a semiconductor device comprising a semiconductor body which is provided at a surface with a first field effect device comprising a source region, a surface-adjoining channel region and a gate electrode located above the channel region and separated from this region by an insulating layer, a second field effect device being present in the semiconductor body in the form of a transistor comprising a source region, a drain region and an intermediate channel region with a gate electrode insulated from the channel region.

The first field effect device can then be constituted by an insulated gate field effect transistor which is connected as a current source. In another important embodiment, the first field effect device constitutes the input stage of a charge-coupled device. The second field effect device, which in both embodiments is constituted by a field effect transistor, can be considered as a resistor. When a current is passed through this transistor, a voltage is generated which is supplied to the first field effect device.

The value of this voltage is generally critical, as will appear from the embodiments to be described. This value may be adjusted, for example, by means of the value of the current which is passed through the second field effect transistor. The usability of this method is very limited, however, because the current soon becomes too large, as a result of which the dissipation becomes too large or too small, so that inertia effects will occur. It is also known to control the resistance through the transistor by means of the threshold voltage. The usual manner of threshold voltage adjustment is to control the doping in the channel region by means of ion implantation. However, in this case a separate implantation step is required, which results in the process becoming more complicated. Moreover, the spread in the threshold voltage is fairly large with the use of this method, i.e. according to the prior art on the order of 100 mV.

SUMMARY OF THE INVENTION

The invention has inter alia for its object to provide a semiconductor device of the kind described above, in which an accurate voltage adjustment can be obtained in a simple and reproducible manner. The invention is based inter alia on the recognition of the fact that the threshold voltage of a field effect device depends upon the channel width—at least below a given value thereof—and that, when other parameters are kept constant, a very accurate adjustment of the threshold voltage can be obtained by means of the channel width.

According to the invention, a semiconductor device of the kind described above is characterized in that the gate electrode and the drain region of the second field effect device are both connected to the gate electrode of the first field effect device and in that the source regions of both field effect devices are also connected to each other, while the channel widths of the two field effect devices, which are so small that the threshold voltages in both field effect devices are determined by narrow channel effects, are different and hence also the threshold voltages in both field effect devices are different. As will appear from the description of the Figures, an accurate adjustment of the threshold voltages can be obtained in an efficacious and reproducible manner and without additional processing steps when the channel widths are chosen in a range in which narrow channel effects play a part.

The narrow channel effects in field effect transistors utilized here are known per se, for example from the article by L. A. Akers, "Threshold Voltage of a Narrow-Width MOSFET" in "Electronics Letters", Jan. 8, 1981, Vol. 17, No. 1, pages 49/50. In this article solely analytic considerations are given. Applications in which narrow channel effects are utilized advantageously are not given in this publication.

BRIEF DESCRIPTION OF THE DRAWING

The invention will be described more fully with reference to several embodiments and the accompanying diagrammatic drawing, in which.

DESCRIPTION OF THE PREFERRED EMBODIMENTS

Figure 1:
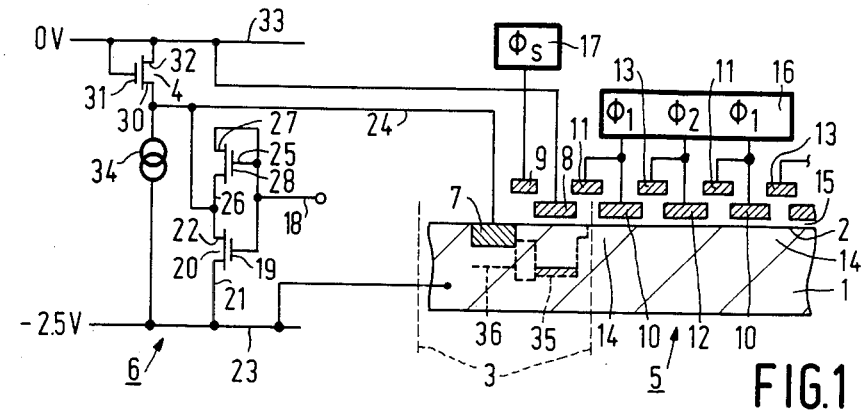
FIG. 1 shows a circuit diagram of a semiconductor device in accordance with the invention.

The first embodiment shown in FIGS. 1-3 relates to the input circuit of a charge-coupled device. By way of example, a device of the n-channel type is described here, but it will be appreciated that the principles of the invention may also be applied to circuits of the p-channel type.

The device comprises a semiconductor body 1 of p-type silicon or a semiconductor body at least the surface layer 1 of which is of the p-type and which layer can be provided on a carrier of the n-type. It should be noted that FIG. 1, which mainly represents the arrangement as a circuit, only shows the part of the semiconductor device 1 which forms part of the charge-coupled device, while the remaining part of the arrangement is drawn only as a circuit. However, it will be appreciated that this part of the device should also be assumed to be integrated in the semiconductor body 1.

The reference numerals 3 and 4 designate two field effect devices, which more particularly are the subject matter of the present invention. The first field effect device 3 comprising the part of the drawing bounded in FIG. 1 by broken lines constitutes the input stage of the charge-coupled device (CCD) 5. The second field effect device 4 is constituted by a field effect transistor which forms part of the input circuit 6.

The input stage 3 comprises an n-type surface zone 7 which is provided at the surface 2 and serves to supply electrons to the charge-coupled device and a gate electrode 8 which is insulated from the semiconductor body 1 and by means of which the electrons supplied by the source 7 can be collected. There is located between the source 7 and the gate electrode 8 a further insulated gate electrode 9 (sample gate), by means of which the connection between the source 7 and the storage site beneath the gate 8 can be closed or interrupted. The input stage is immediately followed by the actual charge-coupled device 5, via which the electrons collected beneath the gate 8 can be transported along the surface 2 to the right, under the influence of the clock voltages $\phi_1$ and $\phi_2$, which are applied to the clock electrodes 10, 11 and 12, 13. By way of example, a device is shown which is operated as a 2-phase surface CCD (SCCD) and for which the clock electrodes of each phase comprise a charge storage electrode 10 or 12, separated from the surface by a comparatively thin oxide, and a charge transfer electrode 11 or 13, separated from the surface by a comparatively thick oxide. By means of the electrodes 11 and 13, which are conductively connected to the electrodes 10 and 12, respectively, potential barriers can be formed in the underlying part of the channel 14, while by means of the electrodes 10 and 12 potential wells can be formed in which charge packets can be stored. The thickness of the oxide layer 15 beneath the gate 8 and the clock electrodes 10 and 12 is, for example, 50 nm; the thickness of the oxide layer beneath the gate electrode 9 and the clock electrodes 11 and 13 is, for example, about 100 nm.

The clock voltages $\phi_1$ and $\phi_2$ can be supplied by a known clock voltage source 16, which is shown only diagrammatically in FIG. 1 and which, if desired, may also be integrated in the semiconductor body 1. The gate electrode 9 is connected to a voltage source 17, which supplies the clock voltage $\phi_S$ and may also be provided in the semiconductor body 1.

The input circuit comprises a signal input 18, through which signals to be stored in the charge-coupled device are supplied. These signals may be either analog or digital signals. By way of example it is assumed that digital information is supplied at a high voltage level representing a logic "1" and a low level representing a logic "0". These signals are applied to the gate electrode 19 of an n-channel insulated gate field effect transistor 20. The source zone 21 of this transistor is connected to the negative supply line 23, while the drain zone 22 of the transistor 20 is connected to the source zone 7 of the CCD input stage 3 via the connection 24. The drain 22 of the transistor 20 is further connected to the source zone 26 of an additional transistor 25, whose drain 27 is connected together with the insulated gate electrode 28 to the signal input terminal 18. The function of this transistor will be explained more fully hereinafter.

The source zone 7 of the CCD input stage 3 is connected to the source zone 30 of the field effect transistor 4 via the connection 24. The gate electrode 31 and the drain 32 of the transistor 4 are connected to each other and to the positive supply line 33. The source zone 30 is further connected to a current source 34, which is further connected to the supply line 33.

During operation, a voltage of, for example, about −2.5 V is applied to the supply line 23 as well as to the substrate 1; the line 33 is connected to reference voltage (0 V). The clock voltages $\phi_1$ and $\phi_2$ (see FIG. 4) are applied to the clock electrodes 10,11 and 12,13, while the sampling clock voltages $\phi_S$ is applied to the electrode 9. Charge packets are introduced by means of the so-called "diode cut-off" method, as is described inter alia in the book "Charge Transfer Devices" by Séquin and Tompsett, Academic Press Inc., New York, 1975, pages 48 and 49. In this method, a connection is established between the source 7 and a potential well 35 under the gate 8 by the application of a positive pulse $\phi_s$ to the sample gate 9, as a result of which charge (electrons) can flow into the potential well 35. Subsequently, the voltage at the gate 9 is reduced to the reference value, as a result of which the connection between the potential well 35 and the source 7 is interrupted and an isolated charge packet is obtained in the potential well 35. By the application of clock voltages to the electrodes 10-13, this charge packet can be transported further through the charge-coupled device.

In FIG. 1, the potential profiles of the input stage 3 are indicated by broken lines, the (positive) potential being plotted in downward direction. The potential well 35 is obtained by connecting the gate 8 to a reference point (0 V). The clock pulses $\phi_1$ and $\phi_2$ vary, for example, between 0 and 5 V, while $\phi_s$ varies between 0 and 5 V.

Figure 4:
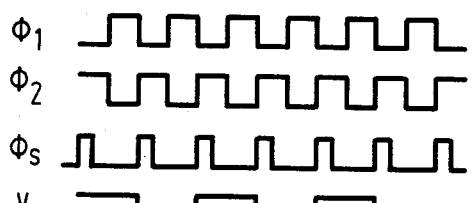
FIG. 4 shows voltages as a function of time which are applied to the device shown in FIG. 1.
Figure 5:
FIG. 5 shows the associated variation of the potential of the input diode 7 in FIG. 1.

The (digital) input signal, which is also shown in FIG. 4 and is supplied via the terminal 18, varies, for example, between 0 V and 5 V. FIG. 5 indicates the potential which is assumed by the source 7 at these two values of the input signal. When the input signal is high (5 V), which corresponds to a logic "1", the transistor 20 is in the conductive state, as a result of which current can flow through the transistors 4 and 20. The transistor 20 is proportioned so that a voltage drop of, for example, 0.1 V is produced across the transistor so that the source zone 7 obtains a voltage of −2.4 V. When a high voltage level is applied to the electrode 9, the potential well 35 under the gate 8 is filled to the brim with charge, after which the connection between the potential well and the source zone is interrupted by the increase of $\phi_s$. The charge packet under the gate 8 is transported further under the first electrode 10 when $\phi_1$ reaches the positive level.

The voltage drop of 0.1 V across the transistor 20 depends not only upon the dimensions of the transistor 20, but also to a great extent upon the threshold voltage. Since this threshold voltage exhibits a fairly large spread, the transistor 25 is incorporated. This transistor, which is manufactured by the same processing steps as the transistor 20 and will therefore exhibit the same spread in threshold voltage, is switched so that the junction point 22,26 is clamped at a voltage of about −2.4 V despite the spread in threshold voltage. In the case in which the threshold voltage of the transistors 20,25 is lower than the envisaged value (as a result of which the voltage drop across the transistor 20 would be too low in the absence of the transistor 25), the transistor 25, whose threshold voltage is also too low, will pass an additional current through the transistor 20 so that the potential at the point 22,26 increases. In the other case, in which the threshold voltage of the transistor 20 is too high and in the absence of the transistor 25 the voltage drop across the transistor 20 would be too large, this voltage increase is counter-acted by the transistor 25, which also has a higher threshold voltage, which results in a smaller current through the field effect transistor 20.

In this simple manner described above, it is possible to supply an accurately-defined "1" to the charge-coupled device.

When $V_{in}$ is low upon the introduction of a logic "0", the transistor 20—like the transistor 25—is non-conducting. In this situation, it is nevertheless desirable to supply a small quantity of charge under the input gate 8 in connection with trapping centers, as described inter alia in the aforementioned book by Séquin and Tompsett, pages 98–106. This reference charge requires that the source 7 of the CCD is connected to an effective drive voltage of about 0.2 V so that the (negative) potential 36 of the source 7 is about 0.2 V above the bottom of the wall 35. Thus, by means of the current source 34 a current i is passed through the transistor 4 which should produce the desired voltage drop across the transistor 4.

Figures 3A, 3B:
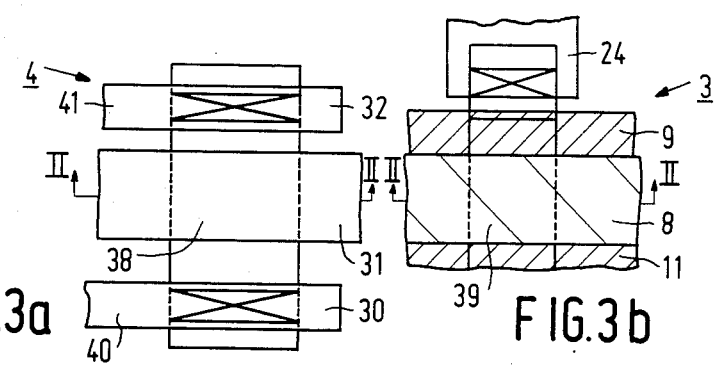

For this purpose, the channel widths of the field effect transistor 4 and of the CCD input part 3 are proportioned with respect to each other so that a suitable adjustment can be obtained by the use of so-called "narrow channel effects". In the present embodiment, the transistor 4 has a 10 μm wide channel with a 5 μm wide channel for the input stage 3 of the charge-coupled device. FIGS. 3a and 3b show diagrammatic plain views of the transistor 4 and the input stage 3. It can be seen in these Figures that the channel 38 of the transistor 4 is about 2 times wider than the channel 19 of the input stage 3 of the charge-coupled device. In these Figures, the source and drain electrodes 40 and 41 of the transistor 4 are also indicated. The contacts between the various conductors and zones in the semiconductor body are denoted by a cross.

Figures 2A, 2B:
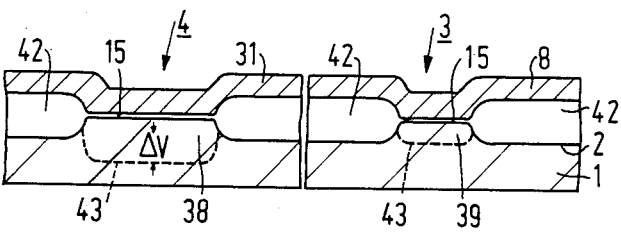
FIGS. 2(a and b) and 3(a and b) are sectional views and plan views, respectively, of the field effect transistor 4 and the input stage of the CCD shown in FIG. 1.

It can be seen in FIGS. 2a and 2b, which are sectional views taken on the line II—II in FIGS. 3a and 3b, respectively, that the channels 38,39 are bounded by comparatively thick field oxide 42. In these Figures, the broken line 43 illustrates the effect the width of the channel has on the threshold voltage. This line represents the surface potential (positive in downward direction) with the same voltage—which is positive with respect to the substrate—at the gates 8 and 31. As is shown in the drawing, the surface potential in the channel 38 of the transistor 4 exceeds that in the channel 39 of the input stage 3 by an amount ΔV.

It can be derived from the article by L. A. Akers, mentioned above, that it approximately holds that:

$$\Delta V = \frac{4\epsilon_{Si}}{\epsilon_{ox}} \frac{D_{ox}}{W} (2\phi_F + V_{sub})$$

where $\epsilon_{Si}$ and $\epsilon_{ox}$ represent dielectric constants of silicon and silicon oxide, respectively, $d_{ox}$ and W are the thickness of the gate dielectric and the channel width, $\phi_F$ is the Fermi potential in the neutral bulk and $V_{substr.}$ is the substrate voltage. In the present case, in which $d_{ox} \approx 50$ nm and a doping concentration of $1.5 \cdot 10^{15}$ atoms/atoms/cm³, it holds approximately that $\Delta V \approx (1.94/W)$, where W = channel width is expressed in μm. Therefore, a threshold voltage difference of about 0.2 V occurs between a 10 μm wide transistor and a transistor (of the same length) having width equal to half that of the former transistor.

The current i required in the circuit diagram of FIG. 1 to obtain an effective drive voltage (the gate voltage minus the threshold voltage) of 0.2 V is equal to $i = (W/L)\beta(\square/2)(V_{drive})2$, where W/L is the width-to-length ratio of the transistor. The factor $\beta\square$ is equal to $\mu_s C_{ox}$, where $\mu_s$ is the surface mobility and $C_{ox}$ is the oxide capacitance. With a gate oxide of about 50 nm, $\beta\square$ is about 36 μA/V².

If W/L were to be chosen to be equal to unity and if in the circuit diagram of FIG. 1 the channel of the transistor 4 is chosen to be equally wide as that of the input stage 3, i.e. 5 μm, the calculations show that the current i becomes very small, i.e. smaller than 1 μA, in order to obtain a difference of 0.2 V. Such a small current would give rise to long charging times. In order to illustrate this, the potential of the input zone 7 is plotted in FIG. 5 as a function of time t at the input signals $V_{in}$ in FIG. 4. The broken line 45 indicates the inertia phenomena which occur if the transistor 4 were to have a channel equally as wide as the input stage 3.

When, according to the invention, the width of the channel of the transistor 4 is instead chosen to be 2 times wider, i.e. 10 μm, i increases not only 2 times, but by a considerably larger amount because of the reduction of the threshold voltage, which supplies an additional drive voltage of 0.2 V. Calculations using the formula $$i = \frac{W\beta\square}{L\,2}(V_{drive})2$$

show that in this case the current i is about 8 μA. This current level is sufficient to obtain the required charging rate (solid line 46 in FIG. 5). This gain is obtained with only a small loss of space in the semiconductor body.

The method of threshold voltage adjustment described here is highly reproducible and has only a small spread. Measurement over a whole slice showed that the spread was smaller than 0.01 V. This is a considerable improvement as compared with the usual ion implantation method, in which according to the prior art a spread of at least 0.05 V is to be expected.

Figure 6:
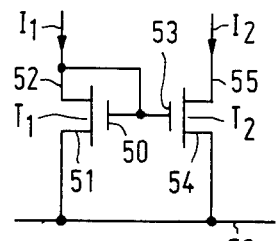
FIG. 6 shows a second embodiment of a semiconductor device in accordance with the invention.

FIG. 6 shows a second embodiment of a semiconductor device in accordance with the invention. In the drawing, only the circuit diagram of this embodiment is shown, but it will be appreciated that this arrangement can again be manufactured in the form of an integrated circuit. The arrangement comprises two n-channel insulated gate field effect transistors $T_1$ and $T_2$, whose threshold voltages $V_{th}$ are determined by the aforementioned narrow channel effects. The gate 50 of $T_1$ is connected on the one hand to the drain zone 52 and on the other hand to the gate 53 of the transistor $T_2$. The source zones 51 and 54 of $T_1$ and $T_2$ are connected to a common supply line 56. The transistor $T_1$ has a W/L ratio of, for example, 5/5 (both in μm); the transistor $T_2$ has a larger W/L ratio of, for example, 10/5. Due to the narrow channel effect, the threshold voltage of $T_2$ is about 0.2 V lower than that of $T_1$. When a current of 2, 10 or 50 pA is passed through $T_1$, the current $I_2$ through $T_2$ will invariably be about 3 μA with a variation of about 1%. In this simple manner, a current source can be obtained which has a comparatively high accuracy.

It will be appreciated that the invention is not limited to the embodiments described here, but that many variations are possible for those skilled in the art without departing from the scope of the invention. For example, the conductivity types of the various zones and regions may be reversed.

What is claimed is:

1. A semiconductor device comprising a semiconductor body having a major surface, a charge coupled device provided at said major surface and comprising an input stage having a source region, a surface-adjoining channel region, and a second gate electrode above the channel region and insulated therefrom for defining a storage site for collecting charge carriers supplied by the source region, said source region and said storage site being switchably connected, said input stage further comprising a first gate electrode above the channel region, insulated therefrom and situated between the source region and said second gate electrode for opening and closing the connection between the source region and said storage site underneath said second gate electrode, the semiconductor body further comprising a field effect transistor having a source region, a drain region, an intermediate channel region, and a gate electrode insulated from the channel region of said field effect transistor, the gate electrode and the drain electrode of said field effect transistor both being connected to said second gate electrode of the input stage of the charge coupled device, a current source, the source region of said input stage and the source region of the field-effect transistor both being connected to said current source, channel widths of the field effect-transistor and the input stage both being so small that threshold voltages in both channels are determined by narrow channel effects, lengths of the channel region of said field-effect transistor and of the channel region below said second gate electrode being equal, and said channel widths being different from each other so that the threshold voltages of said field effect transistor and said second gate electrode are different.

2. A semiconductor device as claimed in claim 1, wherein the channel region of the input stage below the second gate electrode and the channel region of the field-effect transistor have substantially equal dopings and wherein the gate electrode of the field-effect transistor and the second gate electrode of the input stage of the charge coupled device are separated from their respective channel regions by gate dielectrics having substantially the same composition and thickness.

* * * * *